United States Patent
Mengel et al.

(10) Patent No.: US 7,923,823 B2
(45) Date of Patent: Apr. 12, 2011

(54) SEMICONDUCTOR DEVICE WITH PARYLENE COATING

(75) Inventors: Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 536 days.

(21) Appl. No.: 11/626,091

(22) Filed: Jan. 23, 2007

(65) Prior Publication Data

US 2008/0173988 A1    Jul. 24, 2008

(51) Int. Cl.
*H01L 23/495*    (2006.01)

(52) U.S. Cl. .............. 257/666; 257/783; 257/E23.031

(58) Field of Classification Search .......... 257/666, 257/783, E23.031
See application file for complete search history.

(56) References Cited

U.S. PATENT DOCUMENTS

| | | | |
|---|---|---|---|
| 4,173,664 A | 11/1979 | Cieloszyk | |
| 5,012,322 A | 4/1991 | Guillotte et al. | |
| 5,965,947 A * | 10/1999 | Nam et al. | 257/783 |
| 6,107,674 A | 8/2000 | Zommer | |
| 6,228,747 B1 | 5/2001 | Joyner | |
| 6,569,709 B2 * | 5/2003 | Derderian | 438/109 |
| 6,583,505 B2 | 6/2003 | Choi | |
| 6,593,210 B1 | 7/2003 | Rangarajan et al. | |
| 6,743,710 B2 | 6/2004 | Dunham et al. | |
| 6,756,689 B2 | 6/2004 | Nam et al. | |
| 6,844,623 B1 | 1/2005 | Peterson et al. | |
| 6,884,623 B1 | 4/2005 | Lomonossoff et al. | |
| 6,908,784 B1 * | 6/2005 | Farnworth et al. | 438/106 |
| 6,963,125 B2 | 11/2005 | Featherby et al. | |
| 7,060,526 B2 | 6/2006 | Farnworth et al. | |
| 7,262,511 B2 * | 8/2007 | Osako et al. | 257/783 |
| 7,303,942 B2 | 12/2007 | Kuwabara et al. | |
| 2002/0034625 A1 | 3/2002 | Grill et al. | |
| 2002/0125556 A1 | 9/2002 | Oh et al. | |
| 2005/0085008 A1 | 4/2005 | Derderian et al. | |
| 2005/0206010 A1 | 9/2005 | Noquil et al. | |
| 2005/0227415 A1 | 10/2005 | Farnworth et al. | |
| 2006/0263944 A1 * | 11/2006 | Lange | 438/125 |
| 2007/0001278 A1 * | 1/2007 | Jeon et al. | 257/676 |

FOREIGN PATENT DOCUMENTS

DE    102004034397 A1    12/2005
WO    02048702    6/2002

* cited by examiner

*Primary Examiner* — Angel Roman
(74) *Attorney, Agent, or Firm* — Dicke, Billig & Czaja, PLLC

(57) ABSTRACT

A method for producing semiconductor chips has the following steps for this purpose: firstly, a semiconductor wafer having a multiplicity of semiconductor chip positions arranged in rows and columns is provided, wherein the semiconductor wafer has on its front side front sides of semiconductor chips with integrated circuits. The rear side of the semiconductor wafer is provided with a coating having Parylene. The semiconductor wafer is subsequently singulated into semiconductor chips having rear sides on which the coating having Parylene is arranged.

13 Claims, 1 Drawing Sheet

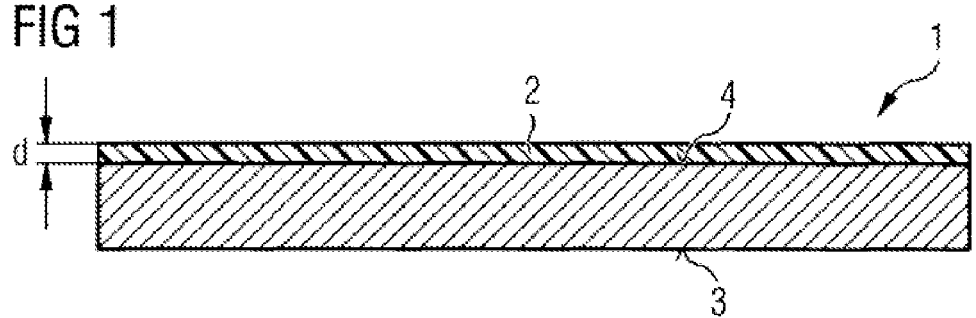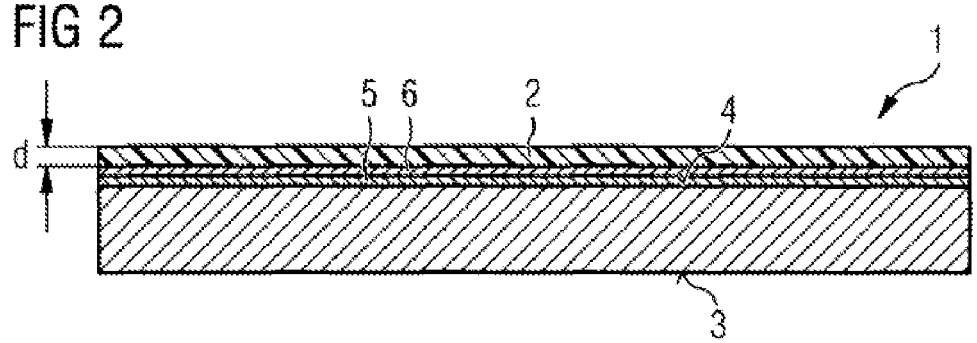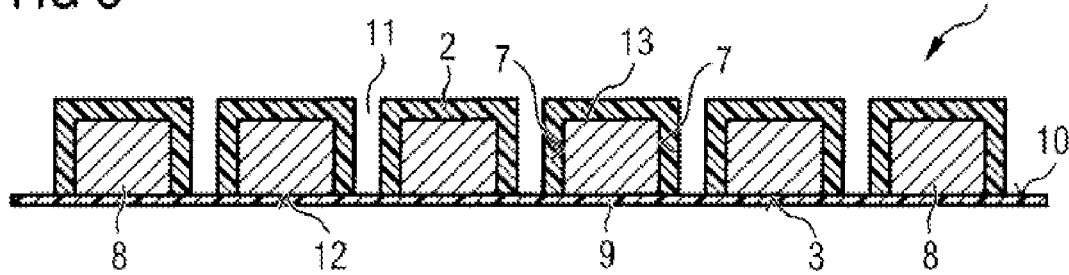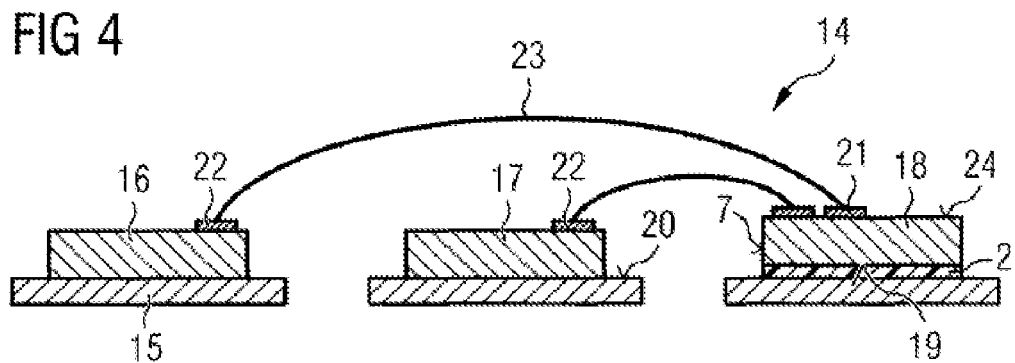

SEMICONDUCTOR DEVICE WITH PARYLENE COATING

BACKGROUND

The invention relates to semiconductor wafers having a multiplicity of semiconductor component positions arranged in rows and columns. It furthermore relates to a power semiconductor module having a power semiconductor chip and a logic semiconductor chip and also a method for producing semiconductor chips.

Semiconductor chips which are arranged as logic semiconductor chips together with a power semiconductor chip on an electrically conductive substrate such as a leadframe, for example, have to be electrically insulated from the substrate. An electrically insulating adhesive is usually used for this purpose, by means of which the semiconductor chip is adhesively bonded by its rear side onto the substrate.

What is disadvantageous in this case is that the electrical insulation capability of adhesives is very limited, particularly if they are intended to have good thermal conduction properties. Moreover, even slight tilting of the semiconductor chip can result in an electrical contact being produced between the chip rear side and the substrate. The use of an adhesive layer as electrical insulation therefore requires great precision during the application of the semiconductor chip.

SUMMARY

A method for producing semiconductor chips includes the following steps: a semiconductor wafer having semiconductor chip positions arranged in rows and columns is provided, wherein the semiconductor wafer has on its front side front sides of semiconductor chips with integrated circuits. The rear side of the semiconductor chip is covered and coated with a coating having Parylene. The semiconductor wafer is subsequently singulated into semiconductor chips on whose rear sides the coating having Parylene is arranged.

A semiconductor power module has the following features: a power substrate, at least one power semiconductor chip arranged on the power substrate and at least one logic semiconductor or driver chip having an active front side, which logic semiconductor chip is mounted by its rear side onto the power substrate, wherein the logic semiconductor chip has a coating having Parylene on its rear side.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 schematically shows a cross section through a semiconductor wafer in accordance with one embodiment of the invention;

FIG. 2 schematically shows a cross section through an alternative embodiment of the semiconductor wafer in accordance with one embodiment of the invention;

FIG. 3 schematically shows a cross section through the semiconductor wafer separated into semiconductor chips in accordance with one embodiment of the invention and FIG. 4 schematically shows a detail from a power semiconductor module in accordance with one embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In accordance with one exemplary embodiment of the invention, a method for producing semiconductor chips includes the following steps: a semiconductor wafer having semiconductor chip positions arranged in rows and columns is provided, wherein the semiconductor wafer has on its front side front sides of semiconductor chips with integrated circuits. The rear side of the semiconductor chip is covered and coated with a coating having Parylene. The semiconductor wafer is subsequently singulated into semiconductor chips on whose rear sides the coating having Parylene is arranged.

In an alternative embodiment of the method, the semiconductor wafer provided is first applied to a sawing film and singulated into semiconductor chips and the rear sides of the singulated semiconductor chips are subsequently coated with the coating having Parylene. The coated semiconductor chips can then be removed from the sawing film.

In this embodiment of the method, in addition to the rear sides of the semiconductor chips, their edge sides can also be provided with the coating having Parylene, with the result that the breakdown strength of the semiconductor chips is additionally increased.

For this purpose, the sawing film is advantageously extended prior to coating, with the result that interspaces are formed between the semiconductor chips and the edge sides of the semiconductor chips are uncovered. If the interspaces that arise during sawing as a result of the material removal are wide enough, it is not necessary for the sawing film to be extended.

It is a consideration that the electrical insulation of the semiconductor chip can be achieved in a particularly simple manner by providing the rear side of the semiconductor chip with an electrical insulation layer simultaneously in the course of its production. This precludes the situation where tilting of the semiconductor chip during its mounting leads to the production of an electrical contact with the substrate. Consequently, particular precision during the application of the semiconductor chip to the substrate is not necessary since the electrical insulation is still present even with a tilted chip.

At least the following conditions should be met for a particularly good electrical insulation of the chip rear side: firstly, the material used for insulation should have a particularly high breakdown strength. Secondly, it should be able to be applied to the rear side of the semiconductor chip with a constant thickness in a simple technical process. Moreover, a high temperature resistance of the insulation material is desirable.

Parylenes meet these conditions and are therefore particularly well suited as insulation materials. They have a high electrical insulation strength; by way of example, a layer having a thickness of 1 µm has an electrical breakdown strength of 500 V. In addition, Parylene takes up only very little moisture and is comparatively elastic, so that it can buffer thermomechanical stresses between semiconductor chip and substrate. In addition, Parylenes often have low coefficients of thermal expansion of less than 50 ppm/K, a high thermal stability and a high chemical resistance.

If the coating is applied prior to the sawing process for separating the semiconductor wafer, it protects the wafer during the sawing process and prevents semiconductor material from breaking off at the edges, so-called chipping. Consequently, the coating also constitutes a mechanical protection layer for the semiconductor wafer or the semiconductor chips. What is more, on account of its insulation properties, it can serve as an ESD (electrostatic discharge) protection layer and prevent electrostatic discharges of the semiconductor wafer and of the semiconductor chips during processing.

The coating is advantageously carried out by means of gas phase polymerization, with the following steps: firstly, the dimer of the compound is evaporated. The dimer is prepared for example by dehydrating pyrolytic dimerization of p-xylene and subsequent quenching in liquid p-xylene. This yields [2, 2]-p-cyclophane. During the subsequent pyrolysis of the dimer, the dimer cleaves into two divalent free-radical monomers such as p-xylene. Upon the deposition of the monomers present in the gas phase on the surfaces to be coated, the polymerization takes place upon cooling.

A very pure Parylene coating can be deposited by means of this process. Consequently, apart from unavoidable contaminants, the coating can be composed completely or almost completely of Parylene.

The evaporation is advantageously carried out at a temperature of 160° C. to 180° C. and a pressure of 1-2 mbar.

The pyrolysis is advantageously carried out at a temperature of 660° C. to 690° C. and a pressure of 0.5-1 mbar.

The polymerization is advantageously carried out at a temperature of less than 35° C. and a pressure of 0.1-0.2 mbar.

In one exemplary embodiment, prior to the application of the coating having Parylene, at least one metal layer is applied to the rear side of the semiconductor wafer or of the semiconductor chips. In this case, the metal layers may have aluminum and/or titanium and/or nickel.

In accordance with further aspects of the present invention, an exemplary semiconductor power module has the following features: a power substrate, at least one power semiconductor chip arranged on the power substrate and at least one logic semiconductor or driver chip having an active front side, which logic semiconductor chip is mounted by its rear side onto the power substrate, wherein the logic semiconductor chip has a coating having Parylene on its rear side.

The semiconductor component has the advantage that the rear side of the logic semiconductor chip is electrically insulated particularly well by the coating having Parylene. In addition, the insulation is intrinsic, that is to say that the coating is part of the chip rear side and, consequently, is not dependent on the type of mounting or jeopardized by tilting of the semiconductor chip.

The coating having Parylene advantageously has a layer thickness d where 500 nm$\leq$d$\leq$5 µm.

Parylene C, Parylene N or Parylene D may be provided for the coating having Parylene. In this case, it is expedient to choose that polymer whose properties best correspond to the requirements. Therefore, Parylene C has a melting point of 290° C. and is highly resistant to water and chemicals. Parylene N has a melting point of 420° C. and a particularly high dielectric breakdown strength of 7 kV/mm. Parylene D has a melting point of 380° C. and maintains its strength and its electrical properties even at high temperatures.

A leadframe is typically provided as the power substrate. However, other substrates are also conceivable.

In one exemplary embodiment, the logic semiconductor chip also has the coating having Parylene on its lateral areas. By virtue of the application of the coating not only on the chip rear sides but also on the edge sides or at least on parts of the edge sides such as, for example, a lower section of the edge sides, the logic semiconductor chip is electrically insulated from the substrate particularly well. Even tilting of the semiconductor chip during application to the substrate does not lead to the production of an electrical contact.

In one exemplary embodiment, at least one metal layer is arranged between the rear side of the logic semiconductor chip and the coating having Parylene, which metal layer may have for example aluminum and/or titanium and/or nickel.

The logic semiconductor chip is advantageously connected by its rear side, which is provided with the coating having Parylene, to the power substrate by means of an adhesive layer. The logic semiconductor chip can be connected particularly simply and permanently to the substrate by means of adhesive bonding. For a better thermal conductivity, the adhesive layer may have electrically conductive particles.

The method is particularly well suited to the application of an insulating coating to the rear side of the semiconductor chip as early as at the wafer level. A semiconductor wafer for having a multiplicity of semiconductor chip positions arranged in rows and columns has on its front side front sides of semiconductor chips with integrated circuits. A coating having Parylene is arranged on the rear side of the semiconductor wafer.

One or a plurality of metal layers between the rear side of the semiconductor wafer and the coating having Parylene may also be applied as early as at the wafer level and have for example aluminum and/or titanium and/or nickel.

The semiconductor wafer 1 in accordance with FIG. 1 has a front side 3 and a rear side 4. Front sides (not shown) of semiconductor chips with integrated circuits are arranged on the front side 3. The rear side 4 is passive; it has no integrated circuits.

A coating 2 having Parylene is arranged on the rear side 4 of the semiconductor wafer 1. In this exemplary embodiment, the coating is composed of Parylene apart from production-dictated contaminants and has a thickness d for which 500 nm$\leq$d$\leq$5 µm holds true. The coating 2 is electrically insulating and has a sufficient breakdown strength even at high voltages in the range of hundreds of volts or a few kilovolts.

FIG. 2 shows an alternative embodiment of the wafer 1. In this embodiment, a metal layer 5 and a further metal layer 6 are arranged between the rear side 4 of the wafer 1 and the coating 2.

In order to produce the coating 2, this exemplary embodiment employs gas phase polymerization, by means of which particularly pure and uniform coatings can be produced in a comparatively simple manner. For this purpose, the semiconductor wafer 1 is introduced into a vacuum chamber in such a way that its front side 3, which has the integrated circuits, is covered, whereas its rear side 4 to be coated or the surfaces of metal layers 5 and 6 arranged on the rear side 4 are uncovered.

After the coating, the semiconductor wafer 1 is singulated into semiconductor chips. As an alternative, however, it is also possible for the edge sides of the semiconductor chips to be coated as well in addition to the rear side 4 of the semiconductor wafer 1. This is illustrated in FIG. 3.

For this purpose, the semiconductor wafer 1 is applied by its front side 3 onto the top side 10 of a sawing film 9 and singulated into semiconductor chips 8. The separation of the semiconductor wafer 1 into semiconductor chips 8 gives rise to interspaces 11 between the semiconductor chips 8, the sawing tracks. Consequently, the edge sides 7 of the semiconductor chips 8 are uncovered.

The semiconductor wafer 1 singulated into semiconductor chips 8 can then be provided with the coating 2. In this case, the semiconductor chips 8 remain with their front sides 12 on the top side 10 of the sawing film 9. The front sides 12 of the semiconductor chips 8 are therefore protected and are kept free of the coating 2.

During the gas phase polymerization, virtually all the uncovered surfaces are coated in the vacuum chamber. Consequently, in this exemplary embodiment, the uncovered edge sides 7 are also provided with the coating 2. Since the Parylene is present at least as a monomer initially in the gas phase, it can readily penetrate into the interspaces 11 and deposits on the edge sides 7 in principle with the same thickness d as on the rear sides 13 of the semiconductor chips 8.

If the interspaces 11 are still not large enough after the separation of the semiconductor wafer 1 into semiconductor chips 8, the sawing film 9 can be extended in order to enlarge them.

After the coating of the semiconductor chips, the latter can be removed from the sawing film 9. They then have a coating 2 both on their rear side 13 and on their edge sides 7 and are therefore electrically insulated particularly well.

The power semiconductor module 14 in accordance with FIG. 4 is only shown schematically in a detail. The power semiconductor module may have for example a bridge or half-bridge circuit with power semiconductor chips. Details of the circuit are not of interest here and are therefore not illustrated. In the exemplary embodiment shown, a first power transistor 16 and a second power transistor 17 are arranged on a power substrate 15. A driver chip 18, which is likewise arranged on the power substrate 15, is provided for the driving of the power transistors.

The driver chip 18 has on its front side 24 contact areas 21 connected to the gate terminals 22 of the power transistors via connecting elements 23 such as bonding wires.

The driver chip 18 has to be electrically insulated from the power substrate 15. For this purpose, it has a Parylene coating 2 on its rear side 19. The driver chip 18 can be fixed on the power substrate 15 for example by means of an adhesive layer (not shown). In this exemplary embodiment, the Parylene coating 2 is only applied to the rear side 19 of the driver chip 18. However, it may additionally also be arranged on the edge sides 7 of said chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor power module, comprising:
   a power substrate;
   at least one power semiconductor chip arranged on the power substrate;
   at least one driver chip having an active front side and a rear side, wherein the driver chip is mounted by the rear side onto the power substrate, and wherein the driver chip has a coating having Parylene on the rear side which electrically insulates the driver chip from the power substrate.

2. The semiconductor power module of claim 1, wherein the coating having Parylene has a layer thickness d where $500 \text{ nm} \leq d \leq 5 \text{ }\mu\text{m}$.

3. The semiconductor power module of claim 1, wherein Parylene C is provided for the coating having Parylene.

4. The semiconductor power module of claim 1, wherein Parylene N is provided for the coating having Parylene.

5. The semiconductor power module of claim 1, wherein Parylene D is provided for the coating having Parylene.

6. The semiconductor power module of claim 1, wherein the power substrate is a leadframe.

7. The semiconductor power module of claim 1, wherein the driver chip includes edge sides including the coating having Parylene.

8. The semiconductor power module of claim 1, wherein at least one metal layer is arranged between the rear side of the driver chip and the coating having Parylene.

9. The semiconductor power module of claim 8, wherein the metal layers have at least one of aluminum, titanium, and/or nickel.

10. The semiconductor power module of claim 1, wherein the driver chip is connected by the rear side, which is provided with the coating having Parylene, to the power substrate by an adhesive layer.

11. The semiconductor power module of claim 1, wherein the adhesive layer has electrically conductive particles.

12. The semiconductor power module of claim 1, wherein the coating is composed completely of Parylene.

13. A semiconductor power module, comprising:
    a power substrate;
    at least one power semiconductor chip arranged on the power substrate ;
    at least one driver chip having an active front side and a rear side, wherein the rear side of the driver chip is covered with a coating including Parylene, wherein the driver chip is mounted by the rear side onto the power substrate with an adhesive, wherein the Parylene coating is separate from the adhesive and electrically insulates the driver chip from the power substrate.

* * * * *